(12) United States Patent
Thomasson

(10) Patent No.: US 6,492,865 B1
(45) Date of Patent: Dec. 10, 2002

(54) BAND PASS FILTER FROM TWO FILTERS

(75) Inventor: Samuel L. Thomasson, Gilbert, AZ (US)

(73) Assignee: Acoustic Technologies, Inc., Mesa, AZ (US)

( * ) Notice: Subject to any disclaimer, the term of this patent is extended or adjusted under 35 U.S.C. 154(b) by 0 days.

(21) Appl. No.: 09/491,998

(22) Filed: Jan. 26, 2000

Related U.S. Application Data

(63) Continuation-in-part of application No. 09/466,313, filed on Dec. 17, 1999.

(51) Int. Cl.[7] ................................................. H03K 5/00
(52) U.S. Cl. ........................ 327/557; 327/552; 330/306
(58) Field of Search ............................... 327/552, 557, 327/558, 553, 554, 555, 556, 559; 330/305, 306

(56) References Cited

U.S. PATENT DOCUMENTS

| | | | |
|---|---|---|---|
| 3,831,103 A | * 8/1974 | Ruegg et al. | ............... 330/109 |
| 4,518,936 A | * 5/1985 | Sutphin, Jr. | .................. 327/91 |
| 4,984,292 A | * 1/1991 | Millen | ........................ 327/557 |
| 5,003,407 A | * 3/1991 | Nakamo et al. | ........... 360/19.1 |
| 5,930,374 A | * 7/1999 | Werrbach et al. | ............. 381/99 |

OTHER PUBLICATIONS

"*Electronic Filter Design Handbook*," A.B. Williams and F.J. Taylor, 3rd Ed., McGraw–Hill, Inc. (1995), pp. 5.42–5.46, 6.38–6.39.

* cited by examiner

*Primary Examiner*—Dinh T. Le
(74) *Attorney, Agent, or Firm*—Paul F. Wille

(57) ABSTRACT

A band pass filter includes a pair of filters having different center frequencies and a difference amplifier coupled to the outputs of the filters. The filters preferably have response curves that intersect at −3 dB. The separation of the center frequencies determines, in part, the ripple in the response curve of the band pass filter.

14 Claims, 7 Drawing Sheets

BAND PASS FILTER FROM TWO FILTERS

CROSS-REFERENCE TO RELATED APPLICATION

This application is a continuation-in-part of Application Ser. No. 09/466,313 filed Dec. 17, 1999, entitled "Band Pass Filter from Two Notch Filters" and assigned to the assignee of this invention.

BACKGROUND OF THE INVENTION

This invention relates to a filter circuit and, in particular, to a band pass filter having a linear phase shift, short group delay, and separately controllable roll-off and ripple.

Band pass filters have been used, alone or combined, in a host of applications virtually since the beginning of the electronic industry. The continuing problem in any application is providing a band pass filter having the desired frequency response. It is known in the art that a band pass filter can include a pair of series coupled resonant circuits that are "de-tuned", i.e. have slightly different resonant frequencies. See for example, *"Radio Engineering"* by Terman, McGraw-Hill Book Company, New York, 1937, pages 76–85.

Today, a band pass filter can be implemented in any one of several technologies. For example, passive analog filters utilize resistors, capacitors, and inductors to achieve the desired frequency response. Active filters add one or more operational amplifiers to prevent a signal from becoming too attenuated by the passive components and to exaggerate or to minimize a particular response by controlled feedback. Switched capacitor circuits are basically analog circuits but divide a signal into discrete samples and, therefore, have some attributes of digital circuits.

Finite Impulse Response (FIR) filters are completely digital, using a shift register with a plurality of taps. An FIR filter generally has a linear phase versus frequency response and a constant group delay. As such, FIR filters find widespread use in digital communication systems, speech processing, image processing, spectral analysis, and other areas where non-linear phase response is unacceptable.

A problem using FIR filters is the number of samples versus the delay in processing a signal. In order to obtain a high roll-off, i.e. a nearly vertical skirt on the response curve, a very large number of taps is necessary. Although the group delay is constant, it is relatively large, ten to fifteen times that of an analog filter, because of the large number of taps. Another problem with FIR filters is ripple, which typically exceeds 3 decibels (dB). There are other digital circuits that could be considered filters but these circuits either do not operate in "real time" or have such long processing times that the delays limit the utility of the techniques.

A problem with a band pass filter is phase distortion, which is proportional to the Q of the filter. A band pass filter has a phase shift associated with it and the phase shift tends to change the most quickly, i.e. non-linearly, at the center frequency of the filter. Signals passing through several band pass filters can acquire a considerable amount of distortion when, in fact, one is trying to improve fidelity. This is particularly true in telephone systems where a signal may be filtered several times on its way from a first telephone, across a switching network, and through a second telephone.

Obtaining a sharp roll-off from an analog filter is often difficult, particularly for narrow band filters, e.g. one third octave or less. Even with active elements, good filters tend to be complex and, therefore, expensive. As noted above, FIR filters can provide a sharp roll-off but typically suffer from longer group delay, making an FIR filter unsuitable in telephone systems, for example.

Frequency response, phase shift linearity, group delay, ripple, and roll-off are characteristics of all filters, whether or not the characteristic is mentioned in a particular application. The Q, or sharpness, of a filter circuit is often specified as the ratio of the center frequency to the band width at −3 dB. A problem with this definition is that the roll-off on each side of the center frequency is assumed to be symmetrical (when amplitude is plotted against the logarithm of frequency). A similar but less critical assumption is made when specifying the band width of a filter as the separation of the −20 dB points in a response curve. If the assumption is not valid, then comparing one filter to another becomes difficult.

In view of the foregoing, it is therefore an object of the invention to provide a band pass filter with a nearly linear phase shift.

Another object of the invention is to provide a band pass filter with short, relatively constant, group delay A further object of the invention is to provide a band pass filter with reduced phase distortion.

Another object of the invention is to provide a band pass filter that is relatively inexpensive despite improved performance when compared with filters of the prior art.

A further object of the invention is to provide a band pass filter having an adjustable ripple;

Another object of the invention is to provide a band pass filter that has an easily adjustable Q.

A further object of the invention is to provide a band pass filter with individually adjustable roll-off on either side of center frequency.

Another object of the invention is to provide a band pass filter having separately adjustable Q and ripple.

SUMMARY OF THE INVENTION

The foregoing objects are achieved in this invention in which an electrical signal is applied to a pair of notch filters having different center frequencies and the output of one notch filter is subtracted from the output of the other notch filter. A band pass filter can also be made from the difference in outputs of a pair of band pass filters. The filters preferably have response curves that intersect at −3 dB. The separation of the center frequencies determines, in part, the ripple in the response curve of the combined band pass filter. The invention can be implemented with active filters, IIR (Infinite Impulse Response) filters, bi-quad filters, or switched-C filters.

BRIEF DESCRIPTION OF THE DRAWINGS

A more complete understanding of the invention can be obtained by considering the following detailed description in conjunction with the accompanying drawings, in which.

DETAILED DESCRIPTION OF THE INVENTION

Figure 1:
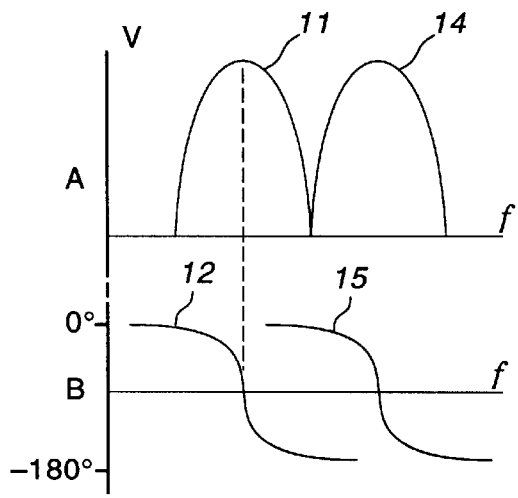
FIG. 1 is a chart illustrating the phase shift characteristic of a band pass filter.

In FIG. 1, curve 11 represents the frequency responses of a first band pass filter (not shown) and curve 12 represents the phase versus frequency response of the same filter. Curve 14 represents the frequency responses of a second band pass filter (not shown) and curve 15 represents the phase versus frequency response of the same filter. The phase changes most rapidly at the center frequencies of the band pass filters and the curves are highly non-linear. This can lead to significant phase distortion, particularly if a signal is passed through several band pass filters.

Figure 2:
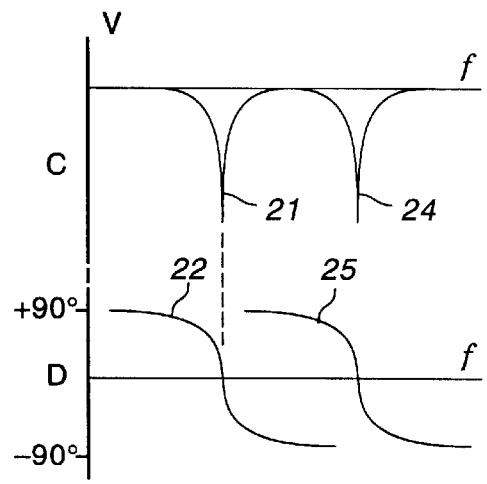
FIG. 2 is a chart illustrating the phase shift characteristic of a notch filter.

In FIG. 2, curve 21 represents the frequency responses of a first notch filter (not shown) and curve 22 represents the phase versus frequency response of the same filter. Curve 24 represents the frequency responses of a second notch filter (not shown) and curve 25 represents the phase versus frequency response of the same filter. The phase versus frequency characteristic of the notch filters is similar to that of the band pass filters except that the phase changes over a range of +90° to −90°. The most rapid phase change also occurs at the center frequency but the center frequency is the point of greatest attenuation. Any signal passed by a notch filter has relatively little phase distortion.

For the sake of clarity, the center frequency of a notch filter is referred to as the "notch frequency" to avoid confusion with the center frequency of a band pass filter.

Looking at curves 21 and 24, the two notch filters represented in FIG. 2 do not equal one band pass filter of FIG. 1. There are several reasons but the most obvious is that the notch filters are operating independently; i.e. frequencies lower than the lower notch and higher than the higher notch are passed by the notch filters. This is not true of a band pass filter. In accordance with the invention, two notch filters are combined to produce the frequency response of a band pass filter.

Figure 3:
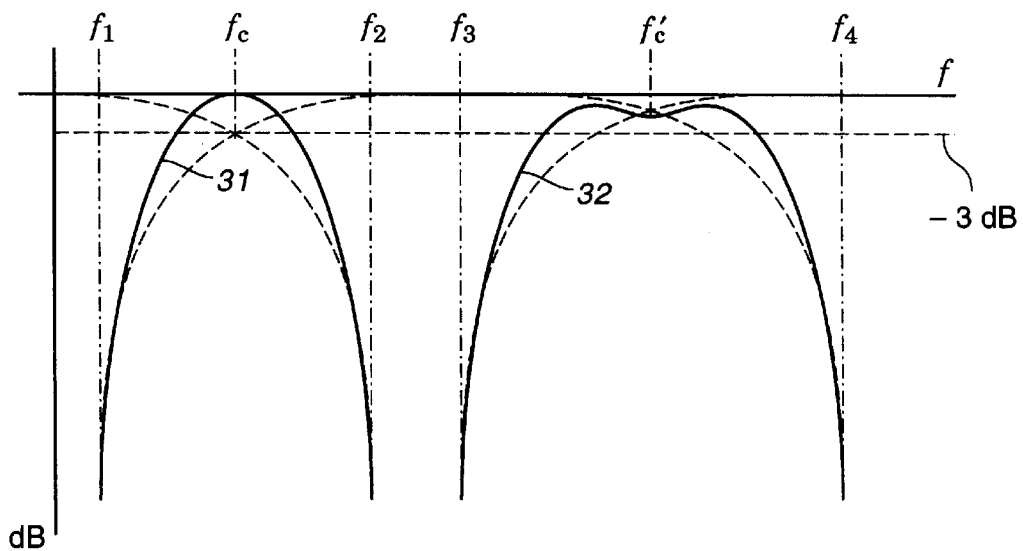
FIG. 3 is a chart illustrating the operation of a band pass filter constructed in accordance with the invention.

In FIG. 3, a notch filter having a notch frequency $f_1$ and a notch filter having a notch frequency $f_2$ have their outputs combined to produce curve 31. The reference level, zero dB, is conventional and could be set to any value depending upon the gain of a particular circuit under consideration. Curve 31 is similar to that of a band pass filter in that the attenuation increases with distance from the center frequency, $f_c$, the frequency midway between $f_1$ and $f_2$ on a logarithmic scale, also known as the geometric mean frequency ($f_c = \sqrt{f_1 \cdot f_2}$).

In accordance with one aspect of the invention, $f_1$ and $f_2$ are separated by an amount such that the individual frequency responses of the notch filters intersect at −3 dB. This provides a response curve with no points of inflection, i.e. no points at which the radius of curvature switches from one side of the curve to the other side of the curve.

In accordance with another aspect of the invention, the notch frequencies are further separated, producing a slight ripple, as shown in curve 32. Specifically, notch frequencies $f_3$ and $f_4$ are spaced such that the response curves of the individual notch filters intersect above the −3 dB level. The amount of ripple is preferably less than 3 dB and, in accordance with yet another aspect of the invention, can be controlled by the spacing of the notch frequencies or by the Q of the notch filters.

Figure 4:
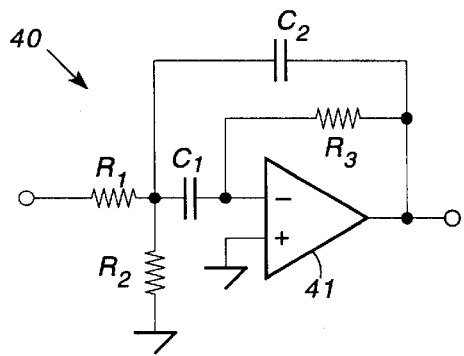
FIG. 4 is a schematic of a band pass filter constructed in accordance with the prior art.

FIG. 4 is a schematic of a band pass filter known in the art. Filter 40 is known as a multiple feedback band pass circuit; see "Electronic Filter Design Handbook" by Williams and Taylor, Third Edition, McGraw-Hill, Inc., 1995, page 5.42–5.46. This is the circuit to which later comparisons are made in connection with FIGS. 6–9.

Figure 5:
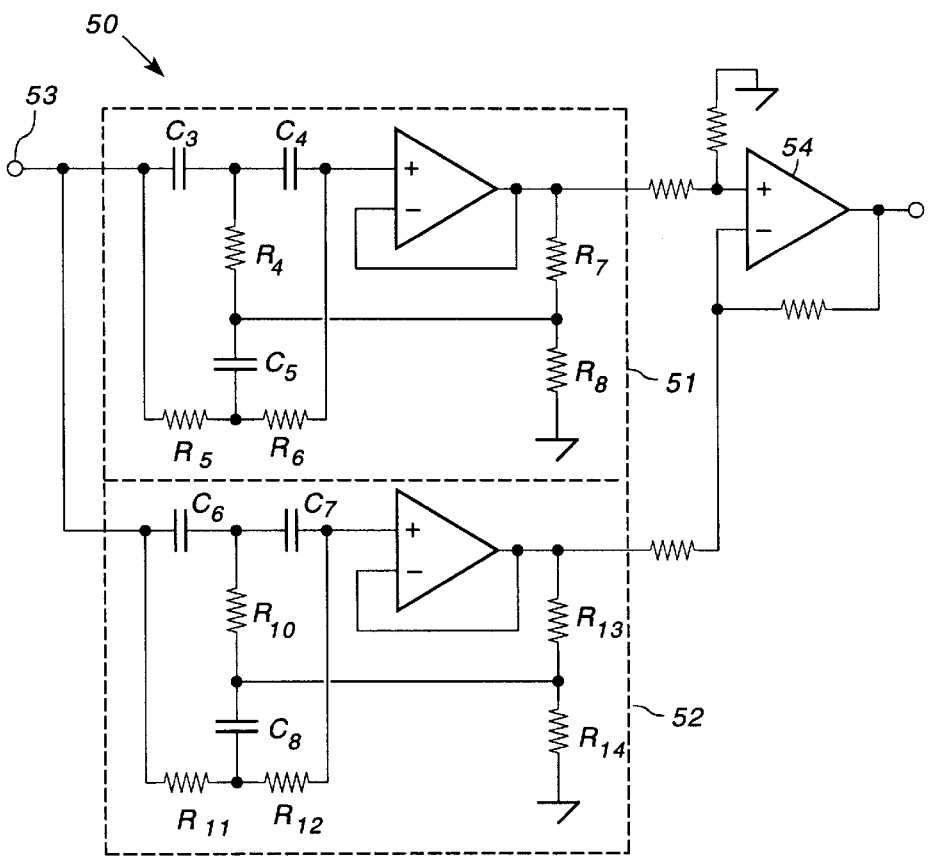
FIG. 5 is a schematic of a band pass filter constructed in accordance with a preferred embodiment of the invention.

FIG. 5 is a schematic of a band pass filter constructed in accordance with a preferred embodiment of the invention. Band pass filter 50 includes two channels, 51 and 52, each containing a notch filter and each connected to input 53. The outputs of the channels are subtracted, not added as one might expect, in amplifier 54.

The particular notch filter chosen is not critical. The notch filter illustrated is known as a twin-T filter with positive feedback; see the Williams and Taylor text, pages 6.38 and 6.39. This particular filter was chosen because of its simplicity, depth of notch, and because the gain can be adjusted easily (e.g. by changing the ratio of resistors $R_7$ and $R_8$) to modify the characteristics of the resulting band pass filter. Note that channels 51 and 52 can be adjusted individually; i.e. the skirts in the response curve of band pass filter 50 can be adjusted separately.

Figure 6:
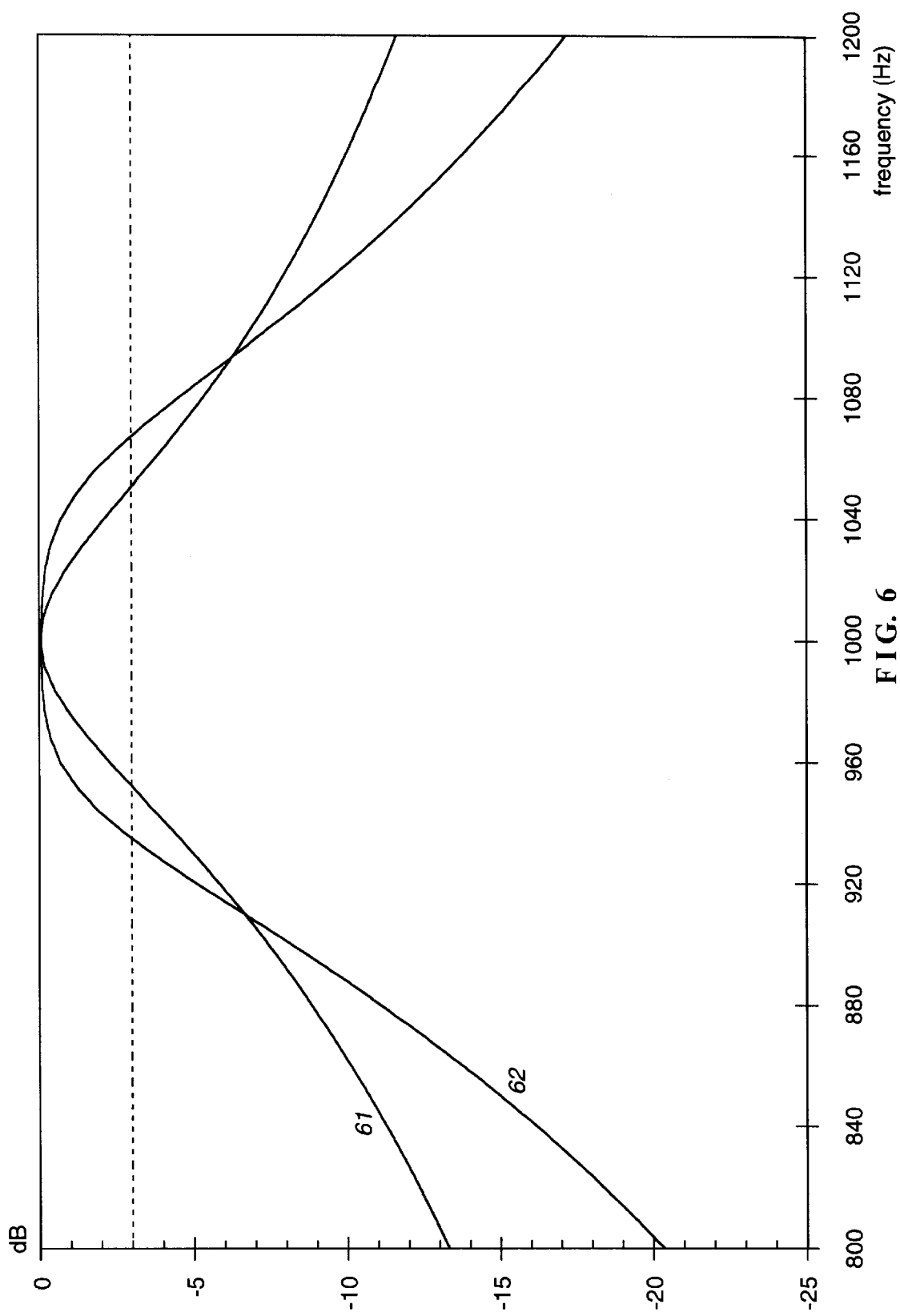
FIG. 6 is a chart comparing the frequency responses of the circuits shown in FIGS. 4 and 5.

FIG. 6 is a chart comparing the response of band pass filter 40 (FIG. 4) with band pass filter 50 (FIG. 5). Data for these curves and the other curves presented were obtained from a simulation of the circuit with "Microcap" software, a widely used and well regarded program from Spectrum Software.

Curve 61 represents the frequency response of filter 40 and curve 62 represents the frequency response of filter 50. The −3 dB points for curve 61 are 951 Hz and 1051 Hz. The −3 dB points for curve 62 are 934 Hz and 1067 Hz. Thus, the Q of filter 40 is numerically higher (10.0 vs. 7.5) than the Q of filter 50 even though the response curves clearly show that filter 50 has the sharper overall response. Measuring Q at −20 dB would be a better indicator of filter performance.

A filter constructed in accordance with the invention can have a frequency response wherein two shoulders defining roll-off are separated by an essentially flat frequency response. As illustrated in FIG. 6, such a response does not fit the standard definition of Q, which should reflect the slope of the skirts rather than the width of the maximum response. From approximately 920 Hz to 1080 Hz, the area between curves 61 and 62 corresponds to significantly more power within the band for filter 50 than for filter 40. There is no standard specification for this phenomenon, although the difference in power is immediately evident to one listening to the signals passing through one filter and then the other filter.

Figure 7:
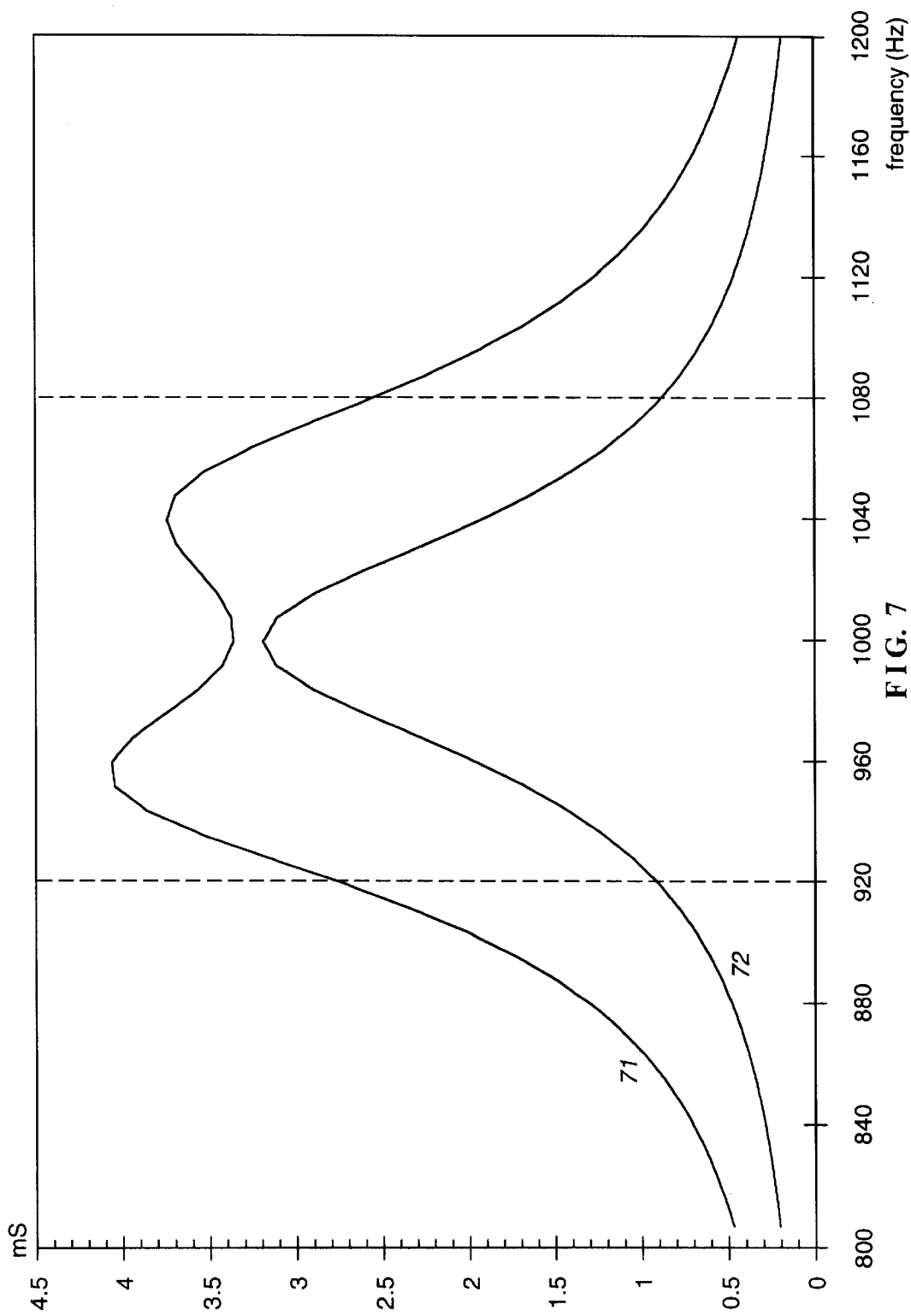
FIG. 7 is a chart comparing the group delay of the circuit shown in FIGS. 4 and 5.

In FIG. 7, curve 71 represents the group delay of filter 50 and curve 72 represents the group delay of filter 40. Although the group delay for filter 50 is slightly higher than the group delay for filter 40, the delay of filter 50 varies over a much narrower range in the middle of the pass band.

The curves for FIGS. 6 and 7 were obtained from circuits having the following component values. The components are correspondingly identified in FIGS. 4 and 5. The resistors coupled to amplifier 54 were all 10 kΩ.

R1=17.5 kΩ
R2=88Ω
R3=35 kΩ
R4=151.9 kΩ
R5=303.8 kΩ
R6=303.8 kΩ
R7=25Ω
R8=975Ω
R10=167 k Ω
R11=334 k Ω
R12=334 k Ω
R13=25Ω
R14=975Ω
C1=90.7 nf
C2=90.7 nf
C3=500 pf
C4=500 pf
C5=1.0 nf
C6=500 pf
C7=500 pf
C8=1.0 nf

Figure 8:
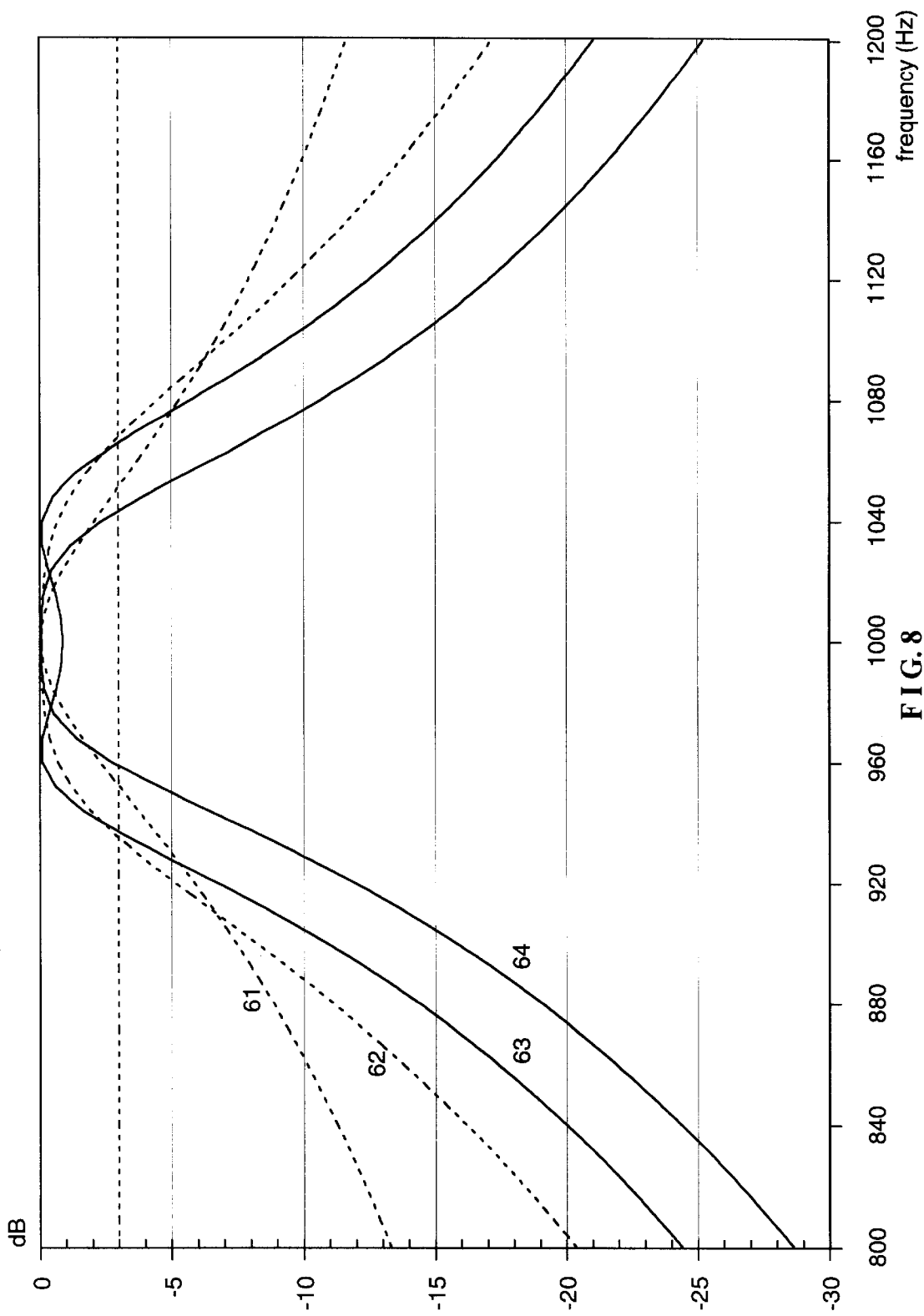
FIG. 8 is a chart showing the effect of circuit changes on the frequency response of the filter shown in FIG. 5.

As described above, one can tailor the frequency response curve for a particular application by changing the Q, the notch frequencies, or the spacing of the notches. FIG. 8 is a chart showing two examples, with the curves from FIG. 6 shown lighter for comparison. Curve 63 is the result of increasing the Q of the circuit by increasing the amount of feedback from the voltage dividers. Specifically, R7 and R13 were each reduced from 25Ω to 15Ω to produce curve 63. No other changes were made.

Increasing the Q produces a slight ripple, about 1 dB, which is tolerable in most applications. Measured at the −3 dB points, curve 63 represents a Q only slightly larger than the Q of filter 50 (curve 62) and less than the Q of prior art filter 40 (curve 61). However, the skirts of curve 63 are considerably narrower than for curve 61 and the amount of power transferred at the center of the pass band is about the same as with filter 50.

For curve 64, the notch frequencies were moved together by increasing the resistor values in the lower frequency notch filter and increasing the resistor values in the higher frequency notch filter. Specifically, the following resistors were changed in value. All other values remained the same as for curve 63.

R4=154.4 kΩ
R5=308.8 kΩ
R6=308.8 kΩ
R10=164 kΩ
R11=328 kΩ
R12=328 kΩ

As can be seen from FIG. 8, the pass band of curve 64 is narrower, even narrower at −3 dB than the prior art filter represented by curve 61. Also, the ripple is gone, despite the higher Q. Note too that the roll-off is exactly the same for curves 63 and 64. Thus, damping is the same despite the narrower pass band and there is no ripple.

Figure 9:
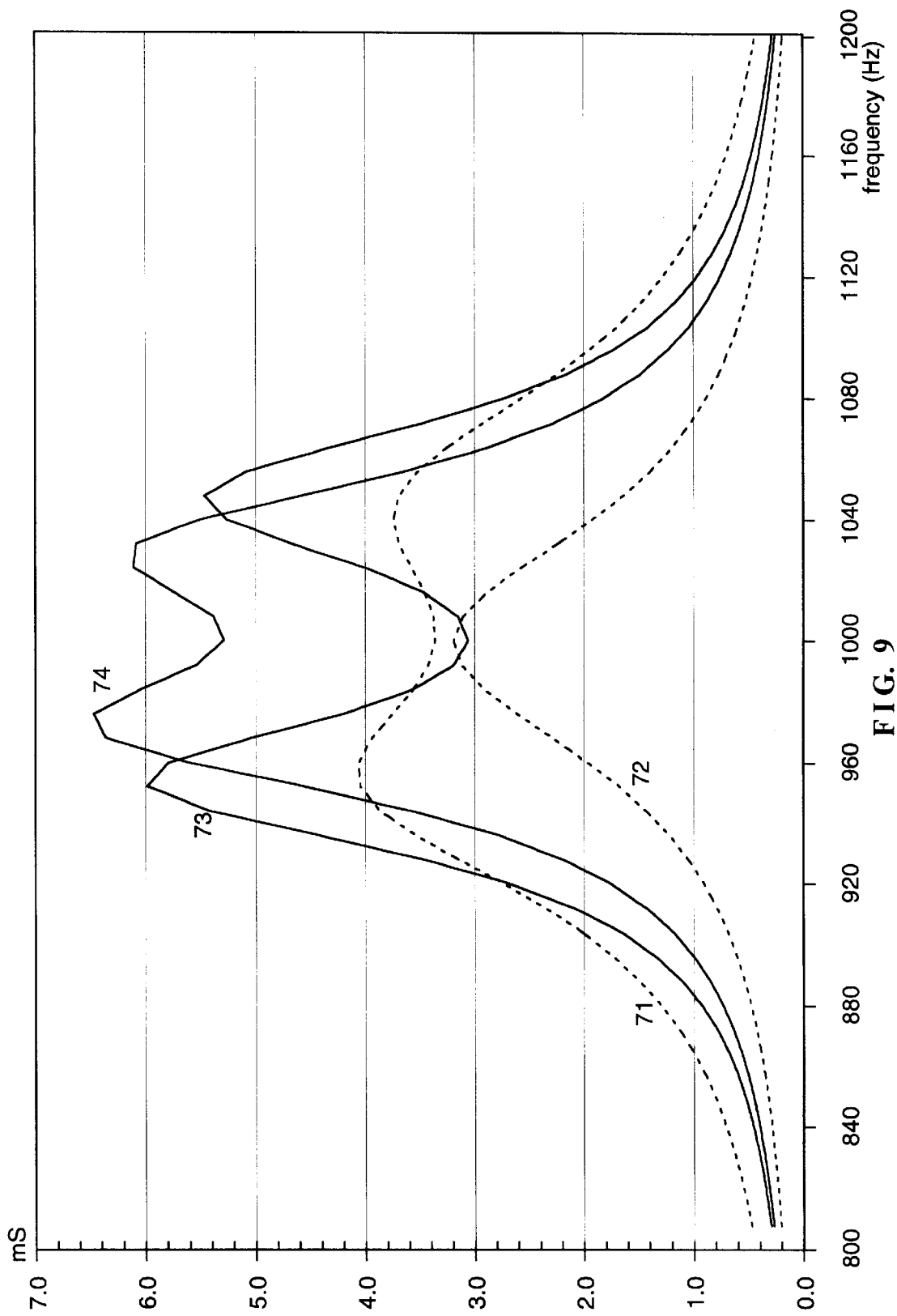
FIG. 9 is a chart showing the effect of circuit adjustments on group delay of the filter shown in FIG. 5.

FIG. 9 illustrates the group delay resulting from increasing Q, curve 73, and moving the notch frequencies closer together, curve 74. Curves 71 and 72 are included for comparison. Although group delay is increased, it remains reasonable. The phase shift introduced by a filter constructed in accordance with the invention is like that shown in FIG. 1 except that the phase varies from +90° to −270° as one proceeds from low frequency to high frequency through the center frequency of the pass band. Although the absolute phase shift has doubled, the phase linearity is better in a band pass filter constructed in accordance with the invention, as shown by FIG. 7.

Figure 10:
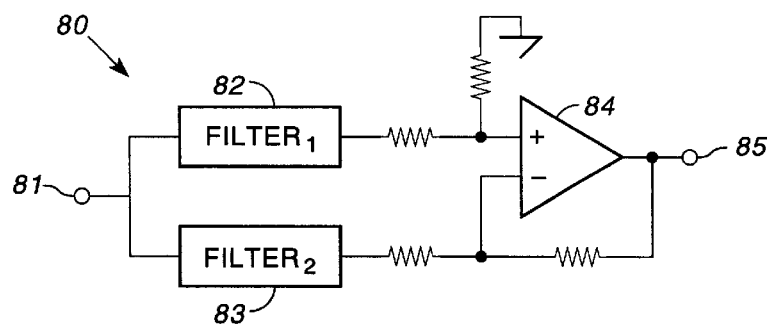
FIG. 10 illustrates a band pass filter constructed in accordance with an alternative embodiment of the invention.

FIG. 10 illustrates an alternative embodiment of the invention in which either band pass filters or notch filters are used in each channel. Using a band pass filter, such as shown in FIG. 4, in each channel also produces a composite band pass filter having improved characteristics. Composite band pass filter 80 includes a pair of filter channels coupled to a difference amplifier, generically the same circuit as shown in FIG. 5. Input 81 is coupled to filter 82 and filter 83, which are the same kind of filter, band pass or notch, but have slightly offset center frequencies. Preferably, the frequency response curve for filter 82 intersects the frequency response curve for filter 83 at −3 dB or less. This prevents the frequency response curve of filter 80 from having more than one peak. The output of filter 82 is coupled to a non-inverting input of filter 84 and the output of filter 83 is coupled to an inverting input of filter 84. The resistors shown all have the same value, e.g. 10 kΩ.

Figure 11:
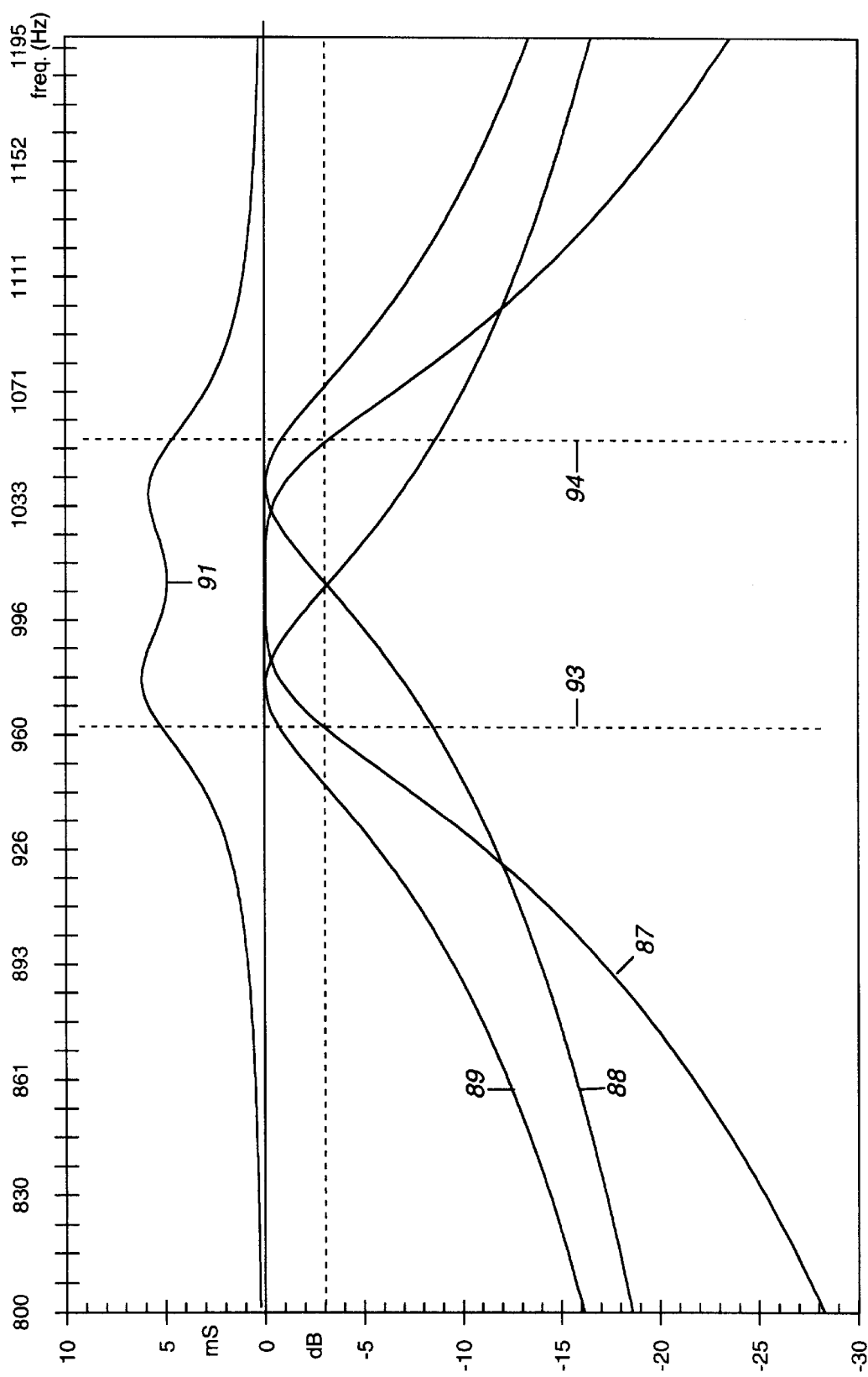
FIG. 11 is a chart illustrating the operation of the circuit in FIG. 10.

FIG. 11 is a chart of the frequency response and group delay for the circuit of FIG. 10 using the band pass filter of FIG. 4 for each of the filters. The component values used are as follows. These values are by way of example only.

|  | Filter 1 | Filter 2 |
| --- | --- | --- |
| $R_1$ | 50 kΩ | 50 kΩ |
| $R_2$ | 100 Ω | 100 Ω |
| $R_3$ | 100 kΩ | 100 kΩ |
| $C_1$ | 51.46 nf | 48.24 nf |
| $C_2$ | 51.36 nf | 48.24 nf |

In FIG. 11, curve 87 represents the frequency response of filter 80 using band pass filters constructed as shown in FIG. 4 with the component values given above. Curves 88 and 89 represent the frequency responses of the individual band pass filters. Curve 91 represents the group delay for filter 80. As in the other embodiment of the invention, curve 87 has a flatter top, more square shoulders, and steeper skirts than curves 88 or 89. The result is more power within the pass band, represented as the region between dashed lines 93 and 94. The group delay, curve 91, is relatively uniform within this region also.

The shape of the frequency response curve and the group delay curve for band pass filter 80 (FIG. 10) can be manipulated in the same manner as described above in connection with two notch filters, e.g by adjusting the separation of the center frequencies and by adjusting the Q of the filters.

The invention thus provides a band pass filter with a linear phase shift, a short, relatively constant, group delay, and individually adjustable roll-off on either side of center frequency. The Q, gain, and spacing of the center frequencies can be adjusted to provide the desired frequency response. The steep skirts of the response curve means that quarter octave, and smaller, band pass filters can be made with the invention. The skirts can be translated, i.e. moved left or right, across frequency without change of shape. Despite such unique properties and flexibility, the filter is relatively inexpensive, making a band pass filter constructed in accordance with the invention ideal for applications requiring a large number of band pass filters, such as equalizers, image processing, and speech processing. Implemented in integrated circuit form as an IIR filter, a filter constructed in accordance with the invention is far smaller and can provide better performance than FIR filters of the prior art.

Having thus described the invention, it will be apparent to those of skill in the art that many modifications can be made within the scope of the invention. For example, although only a filter is shown in each channel in FIGS. 5 and 10, other circuitry can be included in each channel. The outputs of the channels are summed if the signal in one channel is inverted without also inverting the signal in the other channel. The filters in each channel must be the same kind, i.e. both notch or both band pass, but need not be the same circuit. The invention can be implemented in several different technologies, including analog filters, IIR filters, bi-quad filters, and switched-C filters. The invention can be used for band pass filters of any center frequency from sub-audio through radio frequency.

What is claimed as the invention is:

1. A filter for electrical signals, said filter comprising:
   an input;
   a first channel coupled to said input and including a first filter having a first center frequency;
   a second channel coupled to said input and including a second filter having a second center frequency;
   wherein the first center frequency and the second center frequency are not equal; and
   a difference amplifier coupled to said channels for subtracting the signals from the channels;
   whereby the difference amplifier produces an output signal characteristic of a bandpass filter.

2. The filter as set forth in claim 1 wherein the frequency response of the first filter and the frequency response of the second filter intersect at approximately −3 dB.

3. The filter as set forth in claim 1 wherein at least one of said first filter and said second filter is a band pass filter.

4. The filter as set forth in claim 3 wherein said band pass filter is a multiple feedback band pass filter.

5. The filter as set forth in claim 1 and characterized by a frequency response having a ripple of less than 3 dB.

6. A method for processing an electrical signal, said method comprising the steps of:
   applying the electrical signal to a pair of filters having separate center frequencies; and
   subtracting the output of one filter from the output of the other filter to produce an output signal characteristic of a band pass filter.

7. The method as set forth in claim 6 and further including the step of:
   adjusting the pass band by adjusting the separation of the center frequencies.

8. The method as set forth in claim 6 and further including the step of:
   adjusting the pass band by adjusting the gain of at least one of the filters.

9. The method as set forth in claim 6 and further including the step of:
   adjusting the pass band by adjusting the Q of at least one of the filters.

10. A filter for electrical signals, said filter comprising:
    a first channel including a first filter having a first center frequency;
    a second channel including a second filter having a second center frequency;
    wherein the frequency response curve of the first filter intersects the frequency response curve of the second filter; and
    a difference amplifier coupled to said channels for subtracting signals from the channels to produce an output signal characteristic of a bandpass filter having a center frequency between said first center frequency and said second center frequency.

11. The filter as set forth in claim 10 wherein the frequency response of the first filter and the frequency response of the second filter intersect at approximately −3 dB.

12. The filter as set forth in claim 10 wherein at least one of said first filter and said second filter is a band pass filter.

13. The filter as set forth in claim 12 wherein said at least one filter is a multiple feedback band pass filter.

14. The filter as set forth in claim 10 wherein said output signal has a ripple of less than 3 dB across the pass band.

* * * * *